(12) United States Patent
Monk

(10) Patent No.: US 7,880,500 B2
(45) Date of Patent: Feb. 1, 2011

(54) LOGICAL SIGNAL VOLTAGE CONVERTER

(75) Inventor: Trevor Kenneth Monk, Gwent (GB)

(73) Assignee: Icera Inc., Wilmington, DE (US)

( * ) Notice: Subject to any disclaimer, the term of this patent is extended or adjusted under 35 U.S.C. 154(b) by 0 days.

(21) Appl. No.: 12/331,718

(22) Filed: Dec. 10, 2008

(65) Prior Publication Data
US 2009/0153190 A1    Jun. 18, 2009

(30) Foreign Application Priority Data
Dec. 14, 2007   (GB)   ................................ 0724441.1

(51) Int. Cl.
*H03K 19/094* (2006.01)
(52) U.S. Cl. .............................. 326/68; 326/80; 326/81; 326/87; 327/333
(58) Field of Classification Search ................... 326/68, 326/80–83, 86–87; 327/333
See application file for complete search history.

(56) References Cited

U.S. PATENT DOCUMENTS

| | | | | |
|---|---|---|---|---|
| 7,468,615 | B1 * | 12/2008 | Tan et al. ....................... | 326/68 |
| 2002/0175737 | A1 * | 11/2002 | Debaty ........................ | 327/333 |
| 2008/0204110 | A1 * | 8/2008 | Ishida ......................... | 327/333 |

* cited by examiner

*Primary Examiner*—Rexford N Barnie
*Assistant Examiner*—Jany Tran

(57) ABSTRACT

A circuit for converting a lower voltage logical signal to a higher voltage. The circuit comprises a current mirror structure having first and second branches, each comprising at least a first transistor of a first kind, an input transistor of a second kind, and a second transistor of the first kind coupled between them. The first transistors are arranged as a current mirror. The input transistors are driven using a logical signal at the lower voltage, controlling the current mirror structure to output a corresponding logical signal at the higher voltage. The second transistors are driven by an intermediate reference voltage so as to reduce the operating voltage of the third transistors. The first kind is tolerant of a higher operating voltage than the second kind.

20 Claims, 5 Drawing Sheets

LOGICAL SIGNAL VOLTAGE CONVERTER

PRIORITY CLAIM

The present application claims the priority of Great Britain Patent Application No. 0724441.1 filed Dec. 14, 2007.

FIELD OF THE INVENTION

The present invention relates to a circuit for converting a lower voltage logical signal to a higher voltage logical signal.

BACKGROUND

In integrated circuits, different sections of the design are often required to operate at differing voltages, either permanently or on a variable basis. For example, input and output drivers of silicon chips often require 1.8V, 2.5V, or 3.3V signalling whereas the core voltage for the main circuitry operates at a lower voltage, such as 1.0V. To transfer logical signals between these different voltage domains, a level shifter circuit is required. This circuit takes an input signal at voltage Y and translates it to an output signal at voltage X, where X>Y for a low-to-high level shifter, and X<Y for a high-to-low level shifter.

Power consumption of silicon chips is in many applications the most important design metric to consider, and is increasingly becoming important in all areas of chip design. The most effective way of reducing power in a silicon chip is to reduce the supply voltage, since power dissipation is proportional to the cube of supply voltage. Thus, a very low power chip will ideally operate with a very low power supply.

The power supply for the inputs and outputs (I/Os), and various other minor sections of the chip (such as the PLL), are generally fixed. It is predominantly the core voltage, powering most of the high speed transistors on the die, which can be reduced, and which gives the greatest benefit.

Many timing paths on chip, and to/from the chip's I/Os, are critical, and as such it is important that the operation of the level shifter be as fast as possible. Certainly, some applications are not sensitive to speed, however many of them are sensitive and require good performance.

It is also important to keep the implementation of the level shifter simple (in terms of the amount of logic required). For example, a design which requires many intermediate supply domains to translate into during the course of the very low to high voltage level shift will not only be slow, but will also be more complex, as those additional intermediate power domains will need to be routed to all level shifters, maintain good supply integrity, etc. For example, it is preferable to level shift directly from 0.5V to 2.5V without having to go through intermediate voltage levels such as 0.5V to 1.0V to 2.5V, or 0.5V to 1.0V to 1.8V to 2.5V, as these latter solutions would be more complex to implement, and are slow.

Thus, it would be advantageous to have a simple, high speed level shifter implementation which successfully translates between extremely low voltage and high voltage domains.

The implementation of a level shifter to translate from a high voltage down to a very low voltage is relatively trivial. Many suitable circuits are available for this, typically involving NMOS-only pull up/down cascode stacks with cross-coupled PMOS headers, and some buffers.

It is the implementation of a simple high speed level shifter from a lower to a higher voltage domain which poses the greatest difficulty, and for which this invention applies.

SUMMARY

According to one aspect of the present invention, there is provided a circuit for converting a lower voltage logical signal to a higher voltage logical signal, the circuit comprising: at least one current mirror structure comprising a first branch and a second branch, each branch comprising at least a first transistor of a first kind, an input transistor of a second kind, and a second transistor of the first kind coupled between the respective first transistor and input transistor; wherein the first transistor of the first branch and the first transistor of the second branch are arranged as a current mirror so as to mirror the current in the first branch in the second branch; the input transistor of each branch is arranged to be driven using a logical signal at the lower voltage, so as to control the current mirror structure to output a corresponding logical signal at the higher voltage; the second transistor of each branch is arranged to be driven by an intermediate reference voltage so as to reduce the operating voltage of the input transistor; and the first kind is tolerant of a higher operating voltage than the second kind.

Thus advantageously, the present invention does not require a two-stage level shifter, but at the same time it can handle lower voltages because of the lower voltage input transistor in conjunction with a higher voltage second transistor biased with an intermediate reference voltage.

Preferably, the first kind has a gate oxide layer substantially thicker than that of the second kind.

In further embodiments, the circuit may comprise two of said current mirror structures. The two current mirror structures may be coupled together by a pair of cross coupled transistors connected in parallel with the current mirrors.

The input transistor of one of the first and second branches may be connected to be driven by the lower voltage logical signal, and the other input transistor may be connected to be driven by an inverse of the lower voltage logical signal.

Each branch may comprise a third transistor of the first kind coupled between the respective first and second transistors. One of the third transistors may be arranged to be driven in dependence on a feedback signal from said output of the current mirror structure. One of the third transistors may be arranged to be driven in dependence on an enable signal for enabling and disabling the respective branch.

The circuit may comprise latching circuitry operable to force the current mirror structure to output a specified value irrespective of the lower voltage logical signal. The circuit may comprise latching circuitry operable to freeze the output of the current mirror structure.

According to another aspect of the present invention, there is provided a method of converting a lower voltage logical signal to a higher voltage logical signal in a circuit having at least one current mirror structure comprising a first branch and a second branch, each branch comprising at least a first transistor of a first kind, an input transistor of a second kind and a second transistor of the first kind coupled between the respective first transistor and input transistor, the first kind being tolerant of a higher operating voltage than the second kind, the method comprising: using the first transistor of the first branch and the first transistor of the second branch as a current mirror so as to mirror the current in the first branch in the second branch; driving the input transistor of each branch using a logical signal at the lower voltage, so as to control the current mirror structure to output a corresponding logical signal at the higher voltage; and driving the second transistor of each branch with an intermediate reference voltage so as to reduce the operating voltage of the input transistor.

BRIEF DESCRIPTION OF THE DRAWINGS

For a better understanding of the present invention and to show how it may be carried into effect, reference will now be made by way of example to the accompanying drawings in which.

DETAILED DESCRIPTION OF PREFERRED EMBODIMENTS

Figure 4:
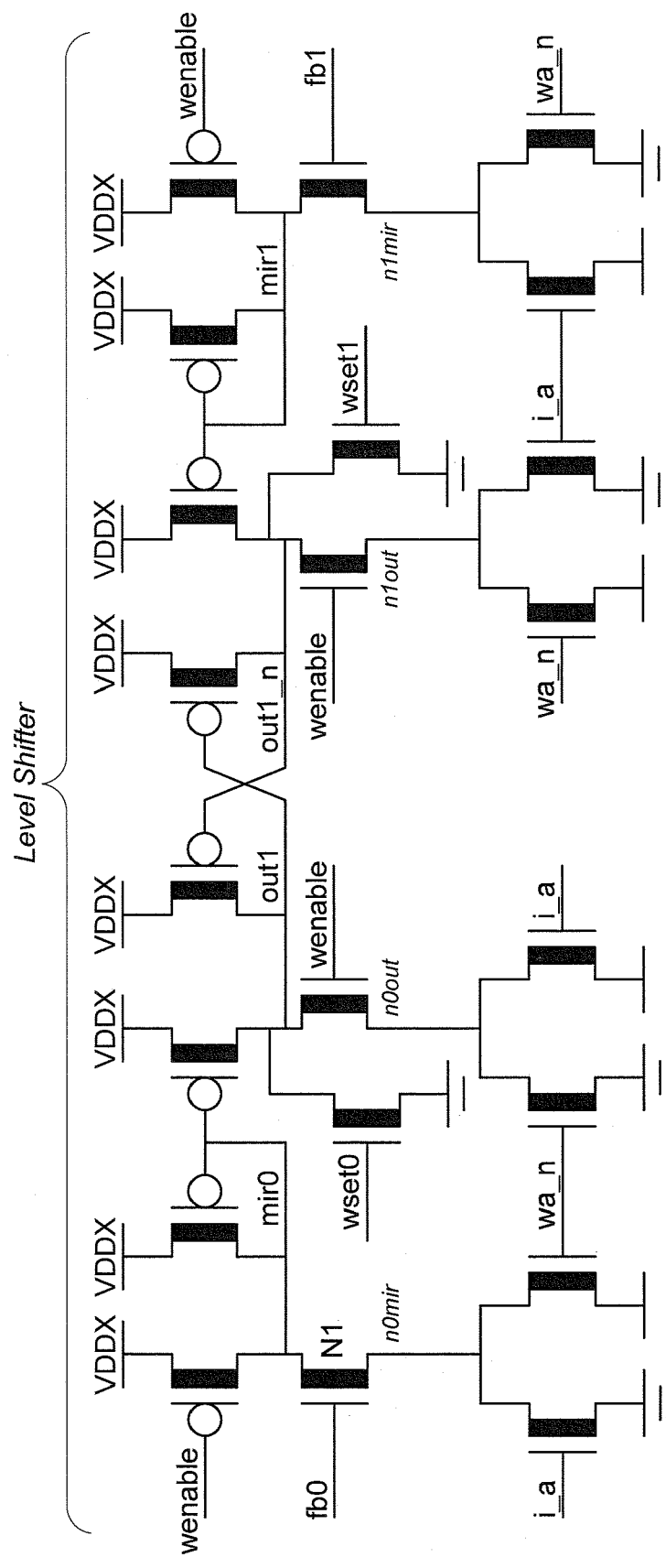
FIG. 4 is a circuit diagram of a level shifter.
Figure 5:
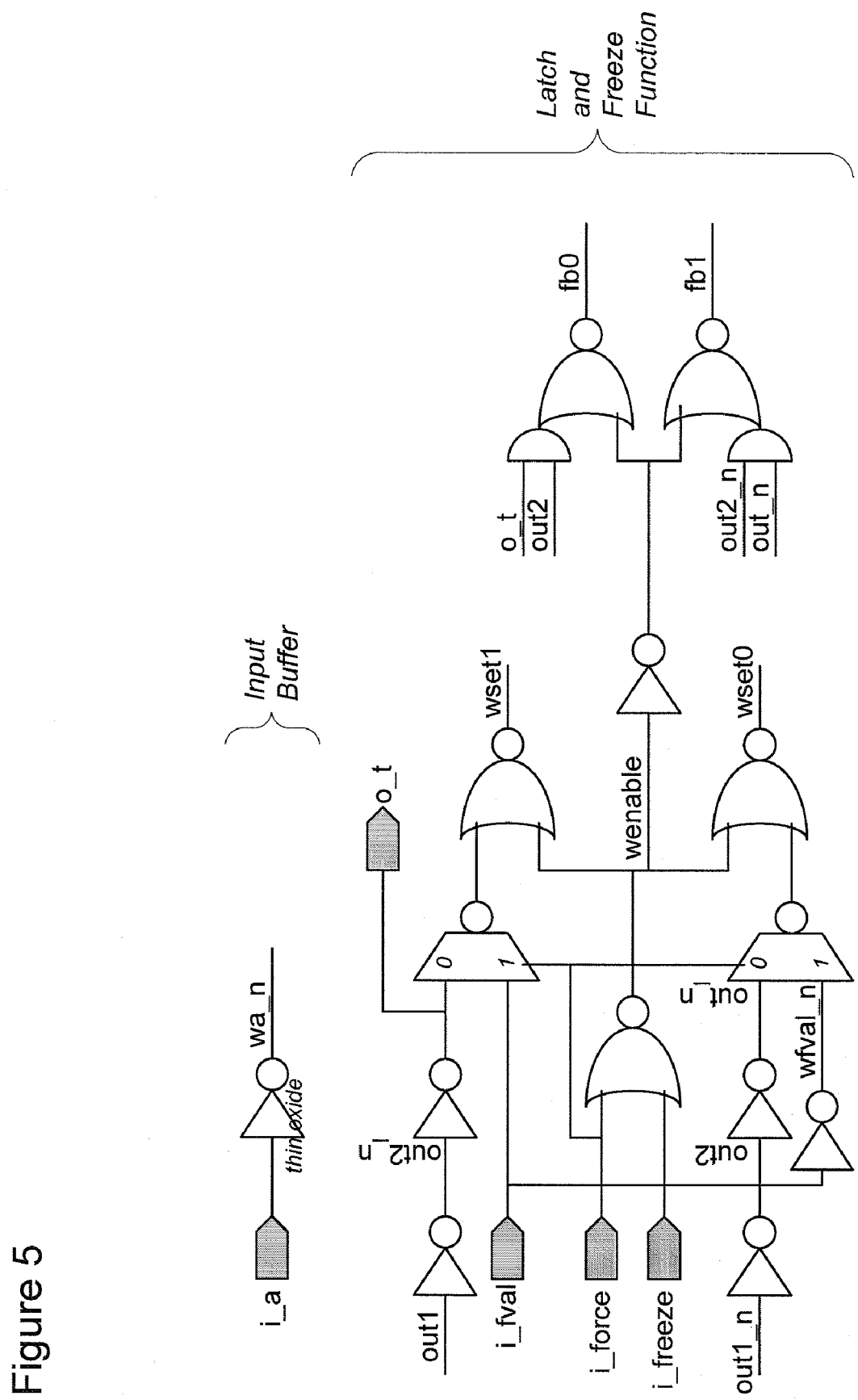
FIG. 5 is a circuit diagram of logic associated with the level shifter of FIG. 4.

One possible circuit for converting logical signals from a lower to a higher voltage domain is shown in FIGS. 4 and 5. This circuit takes a logical signal i_a from a lower voltage domain and converts it to a signal o_t in a higher voltage domain VDDX (the other inputs i_force and i_freeze allow a value to be forced onto the output o_t and the input i_freeze allows a value to be frozen at the output). However, this circuit does not handle as low voltage inputs i_a as might be desired.

Figure 3:
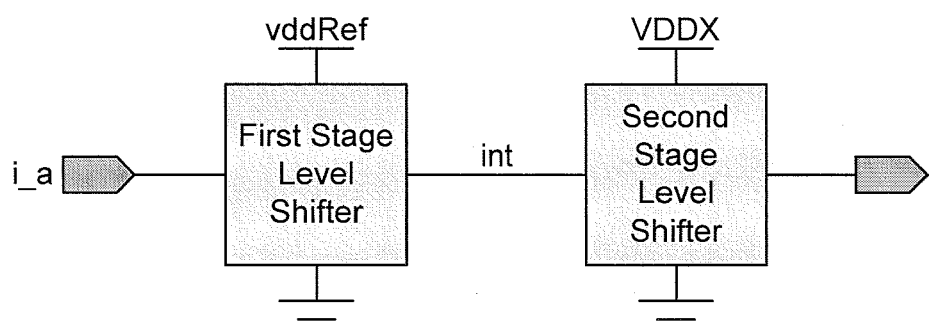
FIG. 3 is a block diagram of a two stage level shifter.

Other circuits may achieve low voltage level shifting by essentially duplicating level shifters from one domain to another. However, as mentioned, it is desirable to keep the implementation of the level shifter simple (in terms of the amount of logic required). For example, a two-level voltage level shifter is illustrated schematically in FIG. 3. Such a design will consume significant power from the intermediate voltage domain vddRef (the first level shifter), as it's required to power all of the circuitry in the first-stage level shifter. This therefore requires careful design of the supply integrity of the intermediate voltage. A multi-stage solution it is also a slower implementation.

So it would be advantageous to provide a low-to-high shifter capable of handling lower input voltages but without requiring an intermediate stage which slows and complicates the circuit.

Figure 1:
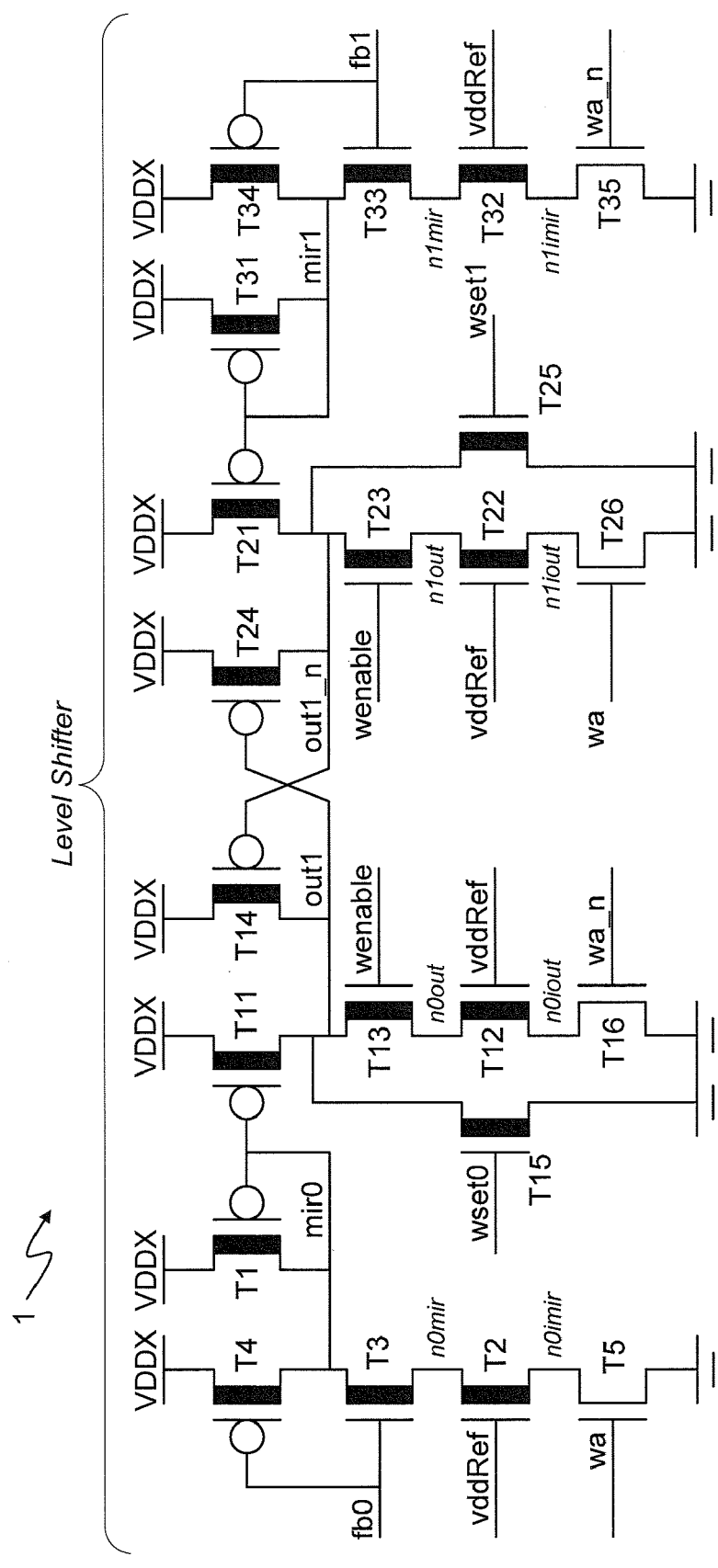
FIG. 1 is a circuit diagram of a level shifter.
Figure 2:
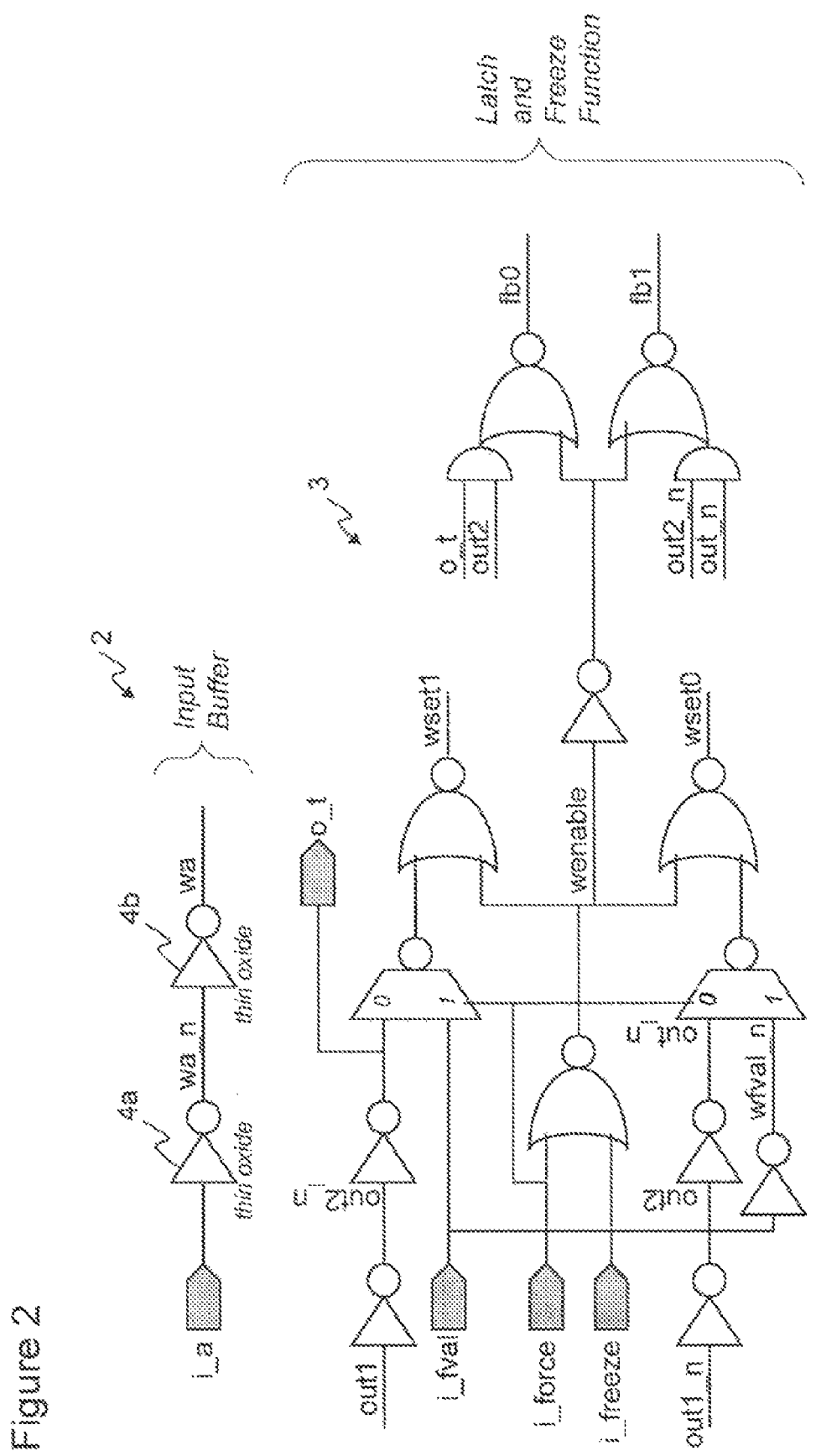
FIG. 2 is a circuit diagram of logic associated with the level shifter of FIG. 1.

A circuit for achieving such an aim according to a preferred embodiment of the invention is now described in relation to FIGS. 1 and 2. The circuit comprises a level shifter 1, an input buffer 2, and latch circuitry 3. The circuit also has an input for receiving a logical signal (i_a) at a lower voltage and an output for outputting a corresponding logical signal (o_t) at a higher voltage. By "logical signal" it is meant a signal taking a logic-high or a logic-low to represent either logic-one binary value or a logic-zero binary value respectively.

The circuit acts to ensure that the output o_t takes the same logical value as the input signal i_a, but in a higher voltage domain (VDDX). That is, a logic-high in the output signal o_t is represented by a higher voltage than a logic-high in the input signal, although of course for both the input and output signals i_a and o_t a logic-low is represented by a level as close to 0V as possible (or vice verse for a negative supply voltage). Or put another way, the "height" of the output signal o_t is greater than the "height" of the input signal i_a.

The input buffer 2 comprises a pair of NOT gates 4a and 4b. The first NOT gate 4a arranged to receive the lower-voltage input signal (i_a). The output of the first NOT gate 4a is arranged to supply an inverse buffered input signal (wa_n) to the level shifter 1, and is also connected to the input of the second NOT gate 4b. The output of the second NOT gate 4b is arranged to supply a buffered input signal (wa) to the level shifter 1.

The latching circuitry 3 comprises logic connected as shown for incorporating certain additional functions into the circuit. This logic enables a specific value to be forced onto the output o_t by asserting a "force" input (i_force) of the latching circuitry 3 to a logic-high and applying the required value to a "value" input (i_fval) of the latching circuitry 3 (in this case the "force" input is asserted by setting it to a logic-high). The illustrated logic also enables the current value of the output (o_t) to be frozen by asserting a "freeze" input of the latching circuitry 3 (in this case the "freeze" input is asserted by setting it to a logic-high). So the latching circuitry 3 allows the circuit to function as a set/reset latch as well as a level shifter. But in normal operation (i.e. as a level shifter whereby a lower voltage logical signal is converted to a higher voltage logical signal), the i_force and i_freeze inputs are not asserted (set to logic-zero).

The level shifter 1 comprises two current-mirror structures (left and right sides in the schematic diagram), each driven off of complementary (and buffered) versions of the input (wa and wa_n), with cross-coupled transistor devices T14 and T24 driven off the outputs (out1 and out1_n). Also each structure may be independently enabled by control logic.

The use of two such structures coupled by cross-coupled devices improves speed and reduces crowbarring, which improves power. Crowbarring is an undesirable current path from the supply to ground which can form when both the NMOS path and the PMOS path are conducting simultaneously. It is a waste of power and it can adversely affect the operation of logic gates.

Each current mirror structure comprises a respective pair of current mirror branches. The first branch of the first (left) current mirror structure comprises a respective first transistor T1, second transistor T2, third transistor T3, and input transistor T5. The second branch of the first current mirror structure also comprises a respective first transistor T11, second transistor T12, third transistor T13, and input transistor T16. The first current mirror structure further comprises a first additional transistor T4, a second additional transistor T14, and a third additional transistor T15.

Similarly, the first branch of the second (right) current mirror structure comprises a respective first transistor T31, second transistor T32, third transistor T33, and input transistor T35. And the second branch of the second current mirror structure comprises a respective first transistor T21, second transistor T22, third transistor T23, and input transistor T26. The second current mirror structure further comprises a respective first additional transistor T34, second additional transistor T24, and third additional transistor T25.

Each of said transistors has a control terminal, a first conducting terminal and a second conducting terminal. In the case of a FET (Field Effect Transistor), the control terminal is the gate, the first conducting terminal is the source and the second conducting terminal is the drain. Preferably each of the transistors is a MOSFET (Metal Oxide Semiconductor Field Effect Transistor).

Each of transistors T1, T4, T11, T14, T21, T24, T31 and T34 is of a first type, in this case PMOS (p-type MOSFET). Each of the other transistors T2, T3, T5, T12, T13, T15, T16, T22, T23, T25, T26, T32, T33 and T35 is of the opposite type, in this case NMOS (n-type MOSFET).

Each of transistors T5, T16, T26, T35 are of type thin-oxide (that is, they are low-voltage transistors which would be damaged if exposed to the full voltage of VDDX), and the remaining transistors in FIG. 1 are of type thick-oxide (that is, they are high-voltage transistors which can safely tolerate VDDX). This is discussed in more detail later.

The transistors T1 and T11 are connected as a current mirror, with each of their sources connected to the supply voltage of the higher voltage domain (VDDX), their gates connected to one another, and the gate of T1 connected to its own drain. So the source-drain current in T1 is mirrored in T11.

To form the rest of the first structure's first current mirror branch, T1, T3, T2 and T5 are then connected in series to ground in that order. That is, the drain of T1 is connected to the drain of T3, the source of T3 connected to the drain of T2, the source of T2 connected to the drain of T5, and the source of T5 connected to ground. The gate of T3 is connected to be driven by a "zero-feedback" signal (fb0) from the latching circuitry 3, the gate of T5 is connected to be driven by the buffered input signal wa, and the gate of T2 is arranged to be driven by an intermediate reference voltage vddRef (i.e. intermediate between the voltages of the higher and lower voltage domains).

To form the rest of the first structure's second current mirror branch, T11, T13, T12 and T16 are connected in series to ground in that order. That is, the drain of T11 is connected to the drain of T13, the source of T13 is connected to the drain of T12, the source of T12 is connected to the drain of T16, and the source of T16 is connected to ground. The gate of T13 is arranged to be driven by an "enable" signal (wenable) received from the latching circuitry 3, the gate of T16 is arranged to be driven by the inverse buffered input signal (wa_n), and the gate of T12 is arranged to be driven by the intermediate reference voltage vddRef.

In addition, T4 is connected in parallel with T1 with its source connected to VDDX and its drain to the drain of T3, and with its gate connected to receive fb0. T14 is connected in parallel with T11 with its source connected to VDDX and its drain connected to the drain of T13. T15 is connected in parallel with all of T13, T12 and T16 with its drain connected to the drain of T11 and its source connected to ground, and with its gate connected to be driven by a "set-zero" signal (wset0) received from the latching circuitry 3.

The first and second branches of the second (right) current mirror structure are connected the same as those of the first structure, as described above, except that: T26 has its gate connected to be driven by the buffered input signal wa, T35 has its gate connected to be driven by the inverse buffered input signal wa_n, T33 has its gate connected to be driven by a "one-feedback" signal (fb1) from the latching circuitry 3, and T25 has its gate connected to be driven by a "set-one" signal (wset1) received from the latching circuitry 3.

Further, as mentioned, T14 and T24 are connected together as a cross-coupled pair. That is, the drain of T14 is connected to the gate of T24 and the drain of T24 is connected to the gate of T14.

The operation of the circuit is described below.

When i_force is logic-1, both multiplexers select the i_fval/wfval_n input. The following NOR gates act as inverters (because wenable is 0 when i_force is 1) and so one of wset0 and wset1 is 1, turning on one of T15 and T25 and forcing the state of the cross-coupled latch.

When i_force is 0 and i_freeze is 1, wenable becomes 0 and this in turn forces fb0 and fb1 to be 0. Thus all the NMOS branches in the current mirrors are turned off (T3, T13, T23, T33) except for the devices T15 and T25 which are driven by the logic in such a way as to maintain the state of the latch. Both PMOS devices T4 and T34 are forced on which ensures that devices T11 and T21 are completely off and leakage currents are minimised. Thus the latch contents are maintained using just devices T14, T15, T24, T25 and there is no possibility of the state of i_a affecting the latch contents.

When both i_force and i_freeze are 0, the level shifter is in its active mode. Signal wenable is 1 and the signals wset0 and wset1 are both 0.

Further, when i_force and i_freeze are both 0 then fb0 is equal to the inverse of o_t and fb1 is equal to o_t. Thus in normal level shifter operation, T13 and T23 are on, T15 and T25 are off, T3 and T34 are on whenever the output signal is low and off whenever the output signal is high, and T4 and T33 are off whenever the output signal is low and on whenever the output signal is high. So fb0 is a "zero-feedback" signal which is asserted when o_t is low and fb1 is a "one-feedback" signal which is asserted when o_t is high. However, note that fb0 and fb1 are slightly delayed relative to the buffered input signal wa and its inverse wa_n.

Note also that T2, T12, T22 and T32 are all permanently biased on by the reference voltage vddRef. The function of these transistors is discussed in more detail later.

Now consider the circuit in a steady state with the input signal i_a being low. This means wa is low, wa_n is high, fb0 is high and fb1 is low. Looking first at the first (left) current mirror structure, T5 is therefore off, T3 is on and T4 is off, so there is no path for current to flow through T1. And because T11 and T1 are connected as a current mirror, then no current will flow through T11 either so T11 must be off. At the same time, T16 is turned on by wa_n and thus out1 is pulled down to ground and the output signal o_t is 0V.

When out1 is low, this also turns on T24 which pulls out1_n up towards the supply voltage VDDX (the supply voltage of the higher voltage domain). And conversely, when out1_n is low it turns T14 off.

Looking at the second (right) current mirror structure, when wa is low then T26 is off, isolating out1_n from ground. At the same time, wa_n is high and fb1 is low, which means T35 is on, T33 is off and T34 is on. Therefore mir1 is pulled up towards the supply voltage VDDX, turning T21 and T31 off.

The steady state with i_a being high is as described above but with the state of the left and right current mirror structures reversed.

All the current mirrors are off in a steady state, and only conduct during switching. Referring again to the first (left) current mirror structure, when the input signal i_a starts to switch from low to high then wa starts to rise and wa_n starts to fall, and so T5 starts to turn on and T16 starts to turn off. Remembering also that fb0 is slightly delayed relative to wa and wa_n, this means that for a brief time during switching all of T3, T5 and T16 are partially on. This means there is a current path through T1, T3, T2 and T5 in the first branch to ground, which is mirrored through T11, T13, T12 and T16 in the second branch. The current in the first branch is increasing (as T5 turns on), while the current in the second branch is decreasing (as T16 turns off). Thus out1 begins to be pulled up towards VDDX.

In the second structure, the cross coupling of T14 and T24 also means that the rising out1 begins to turn T24 off. At the same time the rising wa begins to turn T26 on, pulling out1_n down towards ground.

Once the signals out1 and out1_n have completed their respective transitions, and after a small delay, the signals fb0 and fb1 also change state: fb0 goes low and fb1 goes high. Signal fb0 going low causes T3 to turn off and T4 to turn on, thus forcing mir0 to VDDX and turning off current mirror T11. Signal fb1 going high turns off T34 and turns on T33, thus setting up the new steady-state condition and preparing the right-hand current mirror to respond to any subsequent change of input data.

This feedback switching scheme and active control of current-mirrors is advantageous because it avoids the need for the new data to have to "fight" the stored state (which characterises simple cross-coupled PMOS level-shifters) and therefore can operate reliably over a much wider voltage and process range.

In the described embodiment, it is the inclusion of the second transistors T2, T12, T22 and T32 which allow the invention to advantageously handle lower voltage input signals without requiring multiple level-shifter stages.

As will be familiar to a person skilled in the art, integrated circuits may be fabricated with both thick and thin gate oxide transistors. That is, each transistor may be formed such that the layer of oxide between its gate and its body may have one of two or more discrete, substantially different thicknesses relative to one another. The thicker oxide transistors are slower but can operate at higher voltages, and the thinner oxide transistors are faster but can only operate at relatively low voltages. Or more generally, the invention may apply to any devices optimised for or tolerant of different high and low operating voltage.

In FIG. 1, all of the current mirror structures are built out of thick oxide (slow) devices except for the lowest two devices T5, T6 and T26, T35 in each structure respectively, which are driven off of the low voltage inputs (wa and wa_n) and which are thin oxide (fast) devices. It is the ability to use thin oxide transistor on the inputs which enables low voltage operation. The use of thin oxide devices for these inputs is enabled by the insertion of the thick oxide devices T2, T12, T22 and T32 driven off of an intermediate reference voltage vddRef, which is preferably 1V. To understand why this enables the use of a thin oxide transistor on the input nets, first consider what would happen without the vddRef devices T2, T12, T22 and T32.

Assuming, for example, a 2.5V supply and a thick oxide threshold voltage of 600 mV. Node "n0mir", for example, will be at a voltage equal to the Vgs−Vt of the device T3 driven by "fb0", which is 2.5V−0.6V=1.9V (Vgs is the gate-source voltage and Vt is the threshold voltage). This voltage is still very high, far too high for the use of a fast thin oxide device such as T5 (typically limited to around 1.1V). Instead, a thick oxide device would be required for T5 for the "wa" input. The use of a thick oxide device would limit the minimum operating voltage to be higher than Vt, which is 600 mV. Typically, a few hundred mV above this would be required to develop sufficient current. At 600 mV, the device is still almost off, and almost no current flows. At ~900 mV (1.5× threshold voltage), some small current would flow and thus enable the level shifter to operate, albeit at a very slow rate. This is typical of current state-of-art.

Now consider the addition of the device T2 driven off of vddRef (nominally 1V). Now, the voltage at node "n0mir" is still at 1.9V, but the voltage at node "n0imir" when T5 is off is at Vgs−Vt=1V−0.6V=0.4V, which is safely below the maximum allowed value for thin oxide devices. When T5 is on, it is driven by full logic levels in the low voltage domain, so this device can conduct strongly. This causes the source of T2 to be pulled almost to 0v, so that T2 now has Vgs=1V. This condition is enough to cause T2 to pass a relatively high current and hence enable the level shifter to operate at high speed.

Provided that T5 is sized so that it is always able to pull the source of T2 close to 0v, the operating speed of the level shifter will be substantially independent of the value of the low voltage supply. This is a significant advantage for many applications that require timing to be unaffected by core operating voltage.

Similar comments apply in relation to devices T12, T22 and T32 in the other branches.

Although this level shifter requires the use of an intermediate voltage "vddRef" at 1.0V, it is important to note that it only drives the gate node of the transistors. This means that it has negligible current drain and therefore the integrity of the "vddRef" node is not important. It can be routed to all of the level shifters in the design without the need for maintaining good signal integrity, as very little current is drawn. It is also less susceptible to noise events, which are transient in nature, as they only affect the current sunk for a transient period and therefore affect speed, not functionality. This is to be contrasted to prior-art level shifter implementations which require an intermediate voltage(s). These drive the source/drain of their transistors and therefore sink current, requiring significant design expertise to ensure sufficient supply integrity when routed to all of the level shifters in the design.

Thus using the circuit of FIG. 1, extremely low voltages are enabled by the use of the vddRef device inserted into the pull-down stack. Further, noise on the vddRef node is easily tolerated as the node only drives gate (not source/drain), thereby significantly easing the supply integrity requirements of this node. And high speed is enabled by the use of a single-stage implementation.

It will be appreciated that the above embodiments are described only by way of example. Other variations and uses of the present invention may be apparent to a person skilled in the art given the disclosure herein. The scope of the invention is not limited by the described embodiments, but only by the following claims.

The invention claimed is:

1. A circuit for converting a lower voltage logical signal to a higher voltage logical signal, the circuit comprising:

two current mirror structures each comprising a first branch and a second branch, each branch comprising at least a first transistor of a first kind, an input transistor of a second kind, and a second transistor of the first kind coupled between the respective first transistor and input transistor;

wherein in each of the current mirror structures:

the first transistor of the first branch and the first transistor of the second branch are arranged as a current mirror so as to mirror the current in the first branch in the second branch;

the input transistor of each branch is arranged to be driven using a logical signal at the lower voltage, so as to control the current mirror structure to output a corresponding logical signal at the higher voltage;

the second transistor of each branch is arranged to be driven by a fixed intermediate reference voltage so as to reduce the operating voltage of the input transistor; and the first kind is tolerant of a higher operating voltage than the second kind; and wherein the current mirror structures are coupled together by a pair of cross coupled transistors connected in parallel with the current mirrors.

2. The circuit of claim 1, wherein the first kind has a gate oxide layer substantially thicker than the second kind.

3. The circuit of claim 1, wherein the input transistor of one of the first and second branches is connected to be driven by the lower voltage logical signal, and the other input transistor is connected to be driven by an inverse of the lower voltage logical signal.

4. The circuit of claim 1, comprising latching circuitry operable to force the current mirror structures to output a specified value irrespective of the lower voltage logical signal.

5. The circuit of claim 1, comprising latching circuitry operable to freeze the output of the current mirror structures.

6. A circuit for converting a lower voltage logical signal to a higher voltage logical signal, the circuit comprising:
- at least one current mirror structure comprising a first branch and a second branch, each branch comprising at least a first transistor of a first kind, an input transistor of a second kind, and a second transistor of the first kind coupled between the respective first transistor and input transistor;
- wherein the first transistor of the first branch and the first transistor of the second branch are arranged as a current mirror so as to mirror the current in the first branch in the second branch;
- the input transistor of each branch is arranged to be driven using a logical signal at the lower voltage, so as to control the current mirror structure to output a corresponding logical signal at the higher voltage;
- the second transistor of each branch is arranged to be driven by an intermnediate reference voltage so as to reduce the operating voltage of the input transistor;
- the first kind is tolerant of a higher operating voltage than the second kind; and
- each branch comprises a third transistor of the first kind coupled between the respective first and second transistors.

7. The circuit of claim 6, wherein one of the third transistors is arranged to be driven in dependence on a feedback signal from said output of the current mirror structure.

8. The circuit of claim 6, wherein one of the third transistors is arranged to be driven in dependence on an enable signal for enabling and disabling the respective branch.

9. A method of converting a lower voltage logical signal to a higher voltage logical signal in a circuit having two current mirror structures each comprising a first branch and a second branch, each branch comprising at least a first transistor of a first kind, an input transistor of a second kind and a second transistor of the first kind coupled between the respective first transistor and input transistor, the first kind being tolerant of a higher operating voltage than the second kind, the method comprising in each of the current mirror structures:
- using the first transistor of the first branch and the first transistor of the second branch as a current mirror so as to mirror the current in the first branch in the second branch;
- driving the input transistor of each branch using a logical signal at the lower voltage, so as to control the current mirror structure to output a corresponding logical signal at the higher voltage; and
- driving the second transistor of each branch with a fixed intermediate reference voltage so as to reduce the operating voltage of the input transistor;
- wherein the two current mirror structures are coupled together by a pair of cross coupled transistors connected in parallel with the current mirrors.

10. The method of claim 9, wherein the first kind has a gate oxide layer substantially thicker than the second kind.

11. The method of claim 9, comprising driving the input transistor of one of the first and second branches with the lower voltage logical signal, and driving the other input transistor with an inverse of the lower voltage logical signal.

12. The method of claim 9, comprising using latching circuitry to force the current mirror structures to output a specified value irrespective of the lower voltage logical signal.

13. The method of claim 9, comprising using latching circuitry to freeze the output of the current mirror structures.

14. A method of converting a lower voltage logical signal to a higher voltage logical signal in a circuit having at least one current mirror structure comprising a first branch and a second branch, each branch comprising at least a first transistor of a first kind, an input transistor of a second kind and a second transistor of the first kind coupled between the respective first transistor and input transistor, the first kind being tolerant of a higher operating voltage than the second kind, the method comprising:
- using the first transistor of the first branch and the first transistor of the second branch as a current mirror so as to mirror the current in the first branch in the second branch;
- driving the input transistor of each branch using a logical signal at the lower voltage, so as to control the current mirror structure to output a corresponding logical signal at the higher voltage; and
- driving the second transistor of each branch with an intermediate reference voltage so as to reduce the operating voltage of the input transistor;
- wherein each branch comprises a third transistor of the first kind coupled between the respective first and second transistors.

15. The method of claim 14, comprising driving one of the third transistors in dependence on a feedback signal from said output of the current mirror structure.

16. The method of claim 14, comprising driving one of the third transistors in dependence on an enable signal for enabling and disabling the respective branch.

17. A circuit for converting a lower voltage logical signal to a higher voltage logical signal, the circuit comprising:
- at least one current mirror structure comprising a first branch and a second branch, each branch comprising at least a first transistor of a first kind, an input transistor of a second kind, and a second transistor of the first kind coupled between the respective first transistor and input transistor;
- wherein the first transistor of the first branch and the first transistor of the second branch are arranged as a current mirror so as to mirror the current in the first branch in the second branch;
- the input transistor of each branch is arranged to be driven using a logical signal at the lower voltage, so as to control the current mirror structure to output a corresponding logical signal at the higher voltage;
- the second transistor of each branch is arranged to be driven by a fixed intermediate reference voltage so as to reduce the operating voltage of the input transistor;
- the first kind is tolerant of a higher operating voltage than the second kind; and
- wherein the circuit comprises latching circuitry operable to force the current mirror structure to output a specified value irrespective of the lower voltage logical signal.

18. A circuit for converting a lower voltage logical signal to a higher voltage logical signal, the circuit comprising:
- at least one current mirror structure comprising a first branch and a second branch, each branch comprising at least a first transistor of a first kind, an input transistor of a second kind, and a second transistor of the first kind coupled between the respective first transistor and input transistor;

wherein the first transistor of the first branch and the first transistor of the second branch are arranged as a current mirror so as to mirror the current in the first branch in the second branch;

the input transistor of each branch is arranged to be driven using a logical signal at the lower voltage, so as to control the current mirror structure to output a corresponding logical signal at the higher voltage;

the second transistor of each branch is arranged to be driven by a fixed intermediate reference voltage so as to reduce the operating voltage of the input transistor;

the first kind is tolerant of a higher operating voltage than the second kind; and wherein the circuit comprises latching circuitry operable to freeze the output of the current mirror structure.

19. A method of converting a lower voltage logical signal to a higher voltage logical signal in a circuit having at least one current mirror structure comprising a first branch and a second branch, each branch comprising at least a first transistor of a first kind, an input transistor of a second kind and a second transistor of the first kind coupled between the respective first transistor and input transistor, the first kind being tolerant of a higher operating voltage than the second kind, the method comprising:

using the first transistor of the first branch and the first transistor of the second branch as a current mirror so as to mirror the current in the first branch in the second branch;

driving the input transistor of each branch using a logical signal at the lower voltage, so as to control the current mirror structure to output a corresponding logical signal at the higher voltage;

using latching circuitry to force the current mirror structure to output a specified value irrespective of the lower voltage logical signal; and driving the second transistor of each branch with a fixed intermediate reference voltage so as to reduce the operating voltage of the input transistor.

20. A method of converting a lower voltage logical signal to a higher voltage logical signal in a circuit having at least one current mirror structure comprising a first branch and a second branch, each branch comprising at least a first transistor of a first kind, an input transistor of a second kind and a second transistor of the first kind coupled between the respective first transistor and input transistor, the first kind being tolerant of a higher operating voltage than the second kind, the method comprising:

using the first transistor of the first branch and the first transistor of the second branch as a current mirror so as to mirror the current in the first branch in the second branch;

driving the input transistor of each branch using a logical signal at the lower voltage, so as to control the current mirror structure to output a corresponding logical signal at the higher voltage;

using latching circuitry to freeze the output of the current mirror structure; and driving the second transistor of each branch with a fixed intermediate reference voltage so as to reduce the operating voltage of the input transistor.

* * * * *